United States Patent [19]
Takeda

[11] Patent Number: 6,111,815
[45] Date of Patent: Aug. 29, 2000

[54] SYNCHRONOUS BURST NONVOLATILE SEMICONDUCTOR MEMORY

[75] Inventor: Keiichiro Takeda, Tokyo, Japan

[73] Assignee: Oki Electric Industry Co., Ltd., Tokyo, Japan

[21] Appl. No.: 09/418,307

[22] Filed: Oct. 14, 1999

[30] Foreign Application Priority Data

Nov. 19, 1998 [JP] Japan .................................. 10-329115

[51] Int. Cl.$^7$ ...................................................... G11C 8/00
[52] U.S. Cl. ........................ 365/236; 365/238.5; 365/240
[58] Field of Search .............................. 365/230.08, 236, 365/238.5, 189.05, 189.12, 240

[56] References Cited

U.S. PATENT DOCUMENTS 5,617,361  4/1997  Sugawara ................................. 365/236
5,627,791  5/1997  Wright et al. ............................ 365/236
5,691,955  11/1997 Yamauchi ................................ 365/236
5,805,510  9/1998  Miyakawa et al. ...................... 365/236

*Primary Examiner*—Son T. Dinh
*Attorney, Agent, or Firm*—Jones Volentine, LLP

[57] ABSTRACT

A synchronous semiconductor burst nonvolatile semiconductor memory includes first and second address counter circuits and a counter selection circuit in order to output an address signal to a first latch circuit for storing therein data from a memory cell. Either the first address counter circuit or the second address counter circuit is alternately selected by the counter selection circuit in response to a burst control signal. According to the invention, either the first address counter circuit or the second address counter circuit is always selected, and a burst address signal is outputted to the latch circuit on the basis of an externally supplied address signal (first signal of the burst address signal) before the burst control signal is generated.

9 Claims, 9 Drawing Sheets

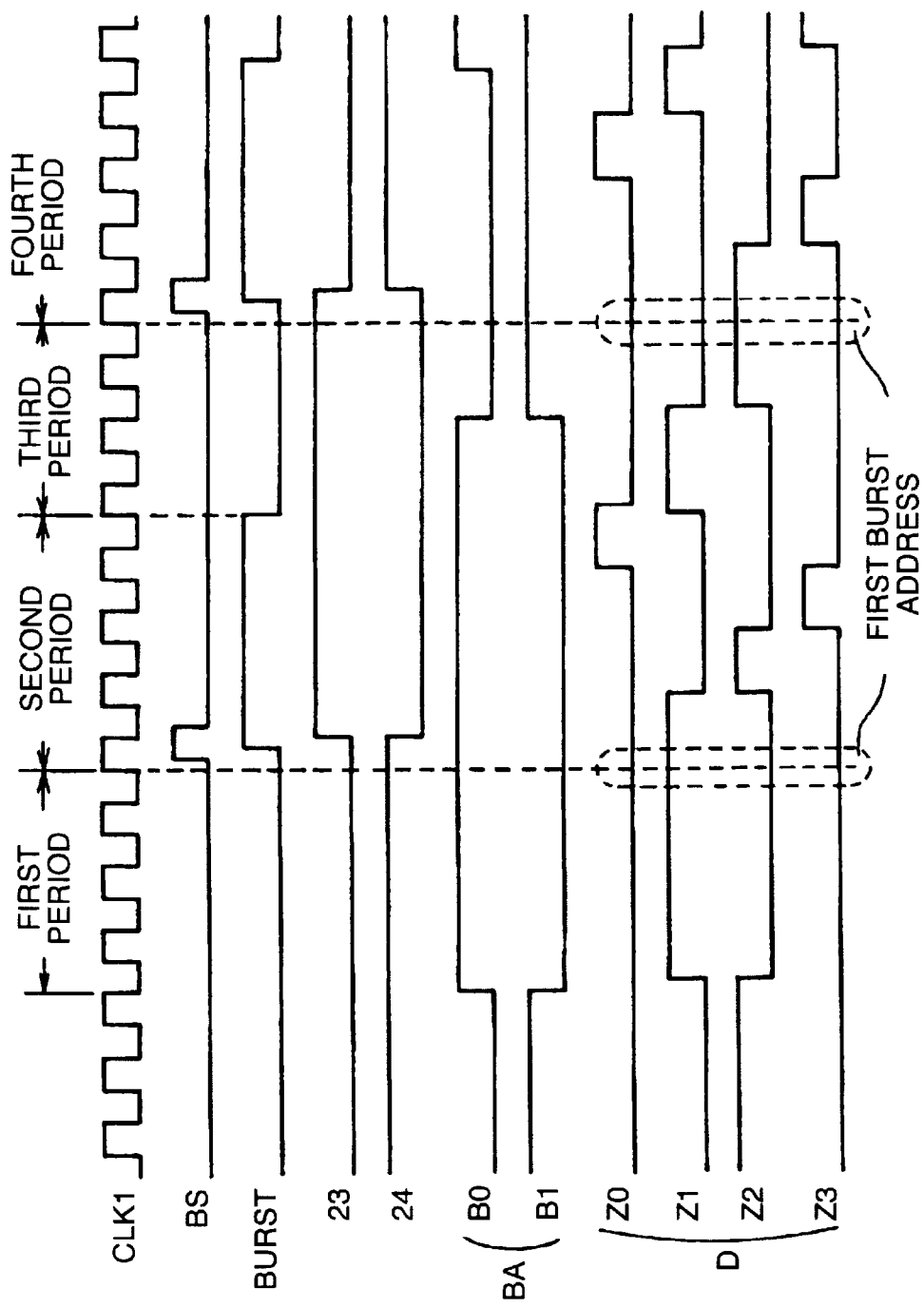

SYNCHRONOUS BURST NONVOLATILE SEMICONDUCTOR MEMORY

BACKGROUND OF THE INVENTION

Field of the Invention

The invention relates to a semiconductor memory, particularly to a circuit arrangement in a synchronous burst nonvolatile semiconductor memory for reading out data.

A synchronous ROM that is a synchronous burst nonvolatile semiconductor memory comprises a memory array having a plurality of memory cells which are arranged in a matrix, a first latch circuit for storing a plurality of data which is read out asynchronously from a part of the memory cell array and outputting each data sequentially which data is stored in each address indicated by an address signal in response to the address signal which is supplied sequentially, an address generation control circuit for outputting a continuous address signal (hereinafter referred to as a burst address signal) to the first latch circuit in response to a burst control signal and a clock signal so as to output data sequentially to the first latch circuit, and a second latch circuit for receiving an output signal from the first latch circuit and outputting the output signal in synchronization with an internal clock signal.

The address generation control circuit has an address counter and a decoder circuit. The address counter latches therein an address signal BA (first address signal of the burst address signal) (hereinafter referred to as address signal BA) from a column latch circuit when receiving a burst control signal BS of H level from a timing control circuit in a state where the address signal BA that is an external binary address data is supplied thereto from the column latch circuit. The address generation control circuit outputs the latched address signal BA to the decoder circuit. The decoder circuit decodes a signal from the address counter and outputs the decoded signal to the first latch circuit. The address counter continuously generates the burst address signal in synchronization with the internal clock signal while a burst control signal BURST from the burst control circuit is high in level (hereinafter simply referred to as H level) after outputting the address signal BA. The address counter outputs the generated burst address signal sequentially to the first latch circuit.

Since the timing control circuit in the synchronous ROM operates in synchronization with the internal clock signal, the burst control signal BS outputted therefrom has a delay from the internal clock signal.

Further, the address signal BA outputted from the address counter is outputted in response to the burst control signal BS.

Accordingly, timing where a signal generated by decoding the address signal BA outputted from the address counter by the decoder circuit is supplied to the first latch circuit has a delay relative to the internal clock signal.

SUMMARY OF THE INVENTION

It is an object of the invention to solve the problem in that a second latch circuit latches therein wrong data and does not output right data to an external device if it takes a long time when an address signal BA arrives a first latch circuit by way of an address counter and a decoder circuit.

To achieve the above object, the invention provides a semiconductor burst nonvolatile semiconductor memory comprising a memory cell group for storing data therein, an input terminal group to which an address signal is supplied, an output terminal group, an intermediate terminal group, a latch circuit, first and second address counter circuits, a selection circuit and a decoder circuit.

The latch circuit stores therein data read out from the memory cell group and outputs the same data from an address indicated by a signal supplied to the output terminal group.

Each address counter circuit of the first and second address counter circuits latches therein an address signal which is supplied to the input terminal group, and outputs the latched address signal to the intermediate terminal group, and a burst address signal generated by itself by counting operation to the intermediate terminal group when receiving a first burst control signal of first level and selected by selection signals. Each address counter circuit of the first and second address counter circuits transfers the address signal which is supplied to the input terminal group to the intermediate terminal group when receiving a first burst control signal of second level, and selected by the selection signals.

The selection circuit outputs the selection signals for alternately selecting the first and second address counter circuits in response to a second burst control signal.

The decoder circuit decodes a signal supplied to the intermediate terminal group and outputs the decoded signal to the output terminal group.

BRIEF DESCRIPTION OF THE DRAWINGS

FIG. 9 is a timing chart of an address generation control circuit in FIG. 7.

DESCRIPTION OF THE PREFERRED EMBODIMENT

Figure 2:
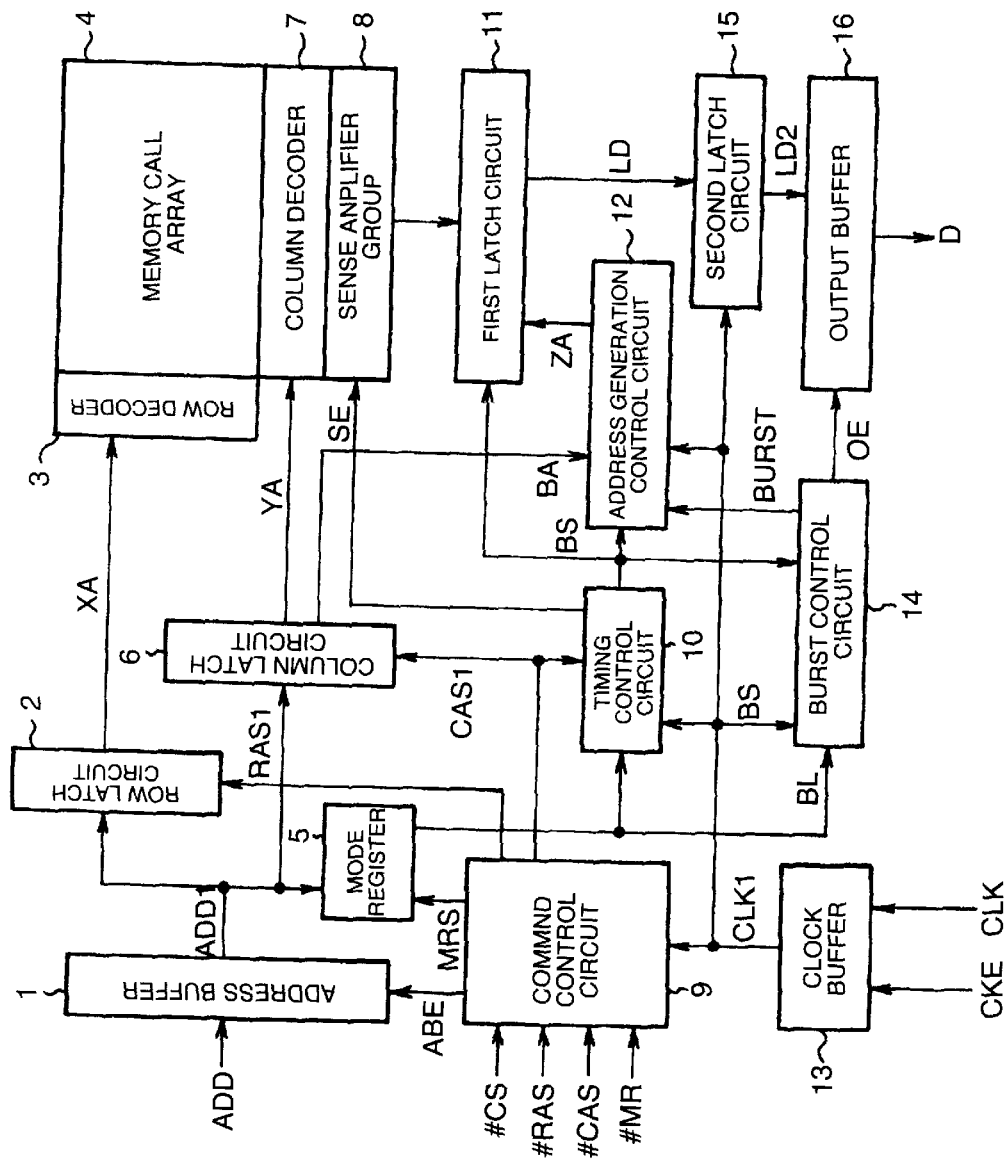
FIG. 2 is a circuit diagram of a synchronous ROM according to a first embodiment of the invention.

FIG. 2 is a schematic view of a synchronous ROM according to a first embodiment of the invention.

Figure 3:
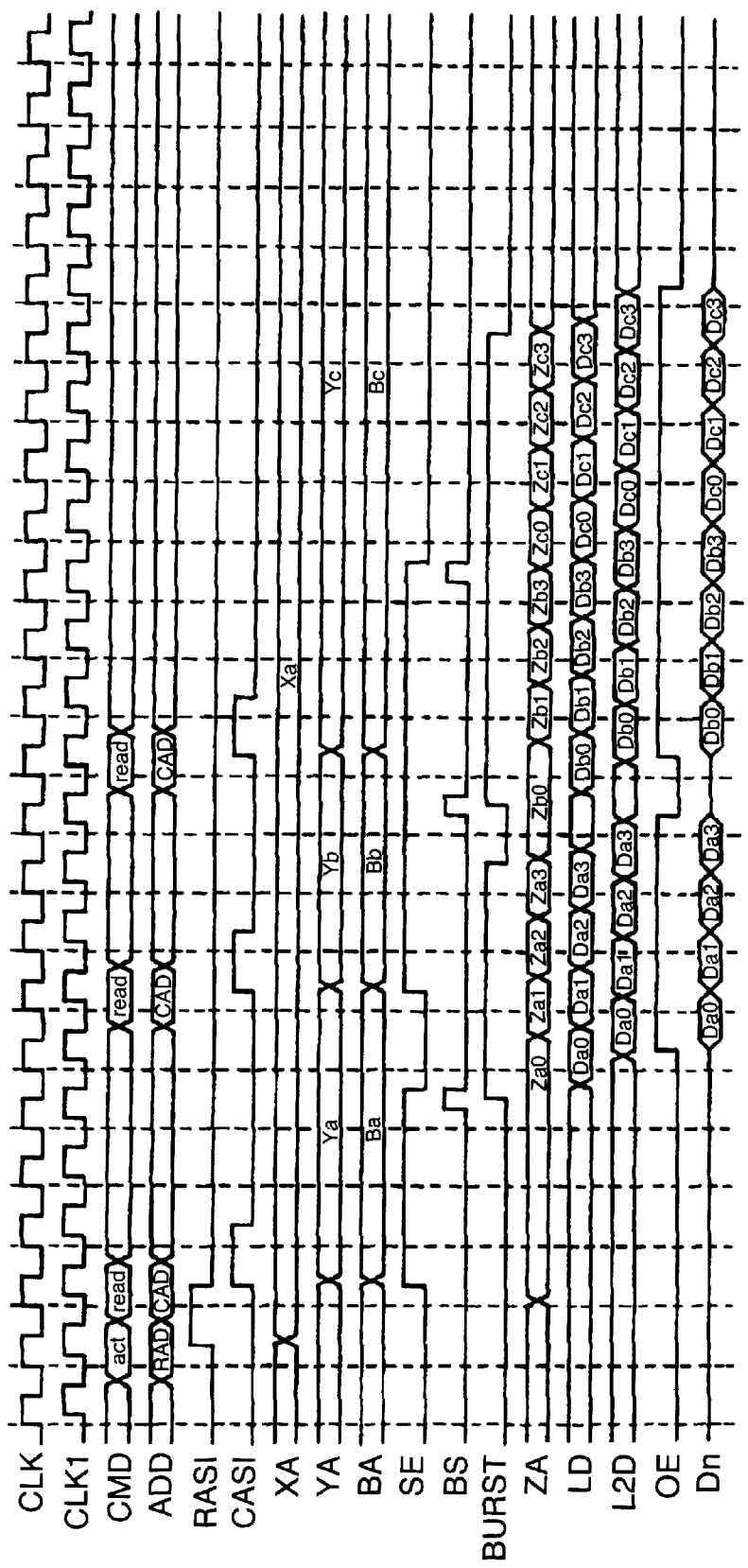
FIG. 3 is a timing chart of the synchronous ROM in FIG. 2.

FIG. 3 is a timing chart of signals outputted by each constituent constituting the synchronous ROM in the first embodiment.

A general operation of the synchronous ROM of the first embodiment is now described with reference to FIG. 2 and FIG. 3.

The ROM of the invention is a type for sharing one sense amplifier relative to multiple bit lines. The ROM of the invention has such a sense amplifier in multiple numbers.

Each sense amplifier is connected to one bit line selected by a column decoder of corresponding multiple bit lines.

The synchronous ROM of the invention has a first latch circuit 11. Plural data which are read out asynchronously by a memory cell array 4 by way of a sense amplifier group 8 is stored in the first latch circuit 11. Thereafter, the first latch circuit 11 outputs data sequentially from an address indicated by a burst address signal which is outputted sequentially from an address generation control circuit 12.

An address buffer 1 outputs an external address signal ADD as an internal address signal ADD1 in response to a signal ABE outputted from a command control circuit 9.

If the command control circuit 9 sets a read command read on the basis of an external signal such as RAS, CAS or the like, it outputs a signal CAS1.

A row latch circuit 2 latches therein an internal address in response to a signal RAS. The row latch circuit 2 outputs a row address signal XA to a row decoder 3. The row decoder 3 selects a word line in response to the row address signal XA.

A column latch circuit 6 latches therein the internal address signal ADD1 in response to the signal CAS1. The column latch circuit 6 outputs a column address signal YA that is a part of the latched internal address signal ADD1 to a column decoder 7, and also outputs an address signal BA (first address signal of the burst address signal) that is a part of the latched internal address signal ADD1 to the address generation control circuit 12.

A CAS latency, that is the number of clocks required from the supply of the read command read to the output of data to an external device, is set in the mode register 5.

A timing control circuit 10 starts operation in synchronization with an internal clock signal CLK1 when receiving the signal CAS1. The timing control circuit 10 operates for a given time during a period when a clock buffer 13 outputs the internal clock signal CLK1 by the number of clocks which are set by the CAS latency. The timing control circuit 10 outputs a signal SE for that period.

The sense amplifier group 8 becomes in an operation state upon reception of the signal SE. A part of data stored in the memory cell array 4 is asynchronously read out and is outputted to the first latch circuit 11.

The timing control circuit 10 outputs the control signal BS of H level after a given period upon reception of the signal CAS1.

The burst length is set in the mode register 5 for outputting a desired number of data from the first latch circuit 11.

A burst control circuit 14 outputs a burst control signal BURST during a burst length period (corresponding to a period when the address generation control circuit 12 outputs desired numbers of address signals so as to allow the first latch circuit 11 to output desired number of data from the first latch circuit 11) in response to the control signal BS of H level.

The first latch circuit 11 latches therein parallel data which are transferred thereto in parallel from the sense amplifier group 8 when receiving the control signal BS. The first latch circuit 11 serially outputs data LD which is latched in an address indicated by a burst address signal ZA which is supplied thereto sequentially from the address generation control circuit 12.

A second latch circuit 15 outputs a serial data LD sequentially to an output buffer 16 as data LD2 in synchronization with the internal clock CLK1. The output buffer 16 outputs data LD2 to an external device as data D in response to an output control signal OE outputted by the burst control circuit 14.

Figure 1:
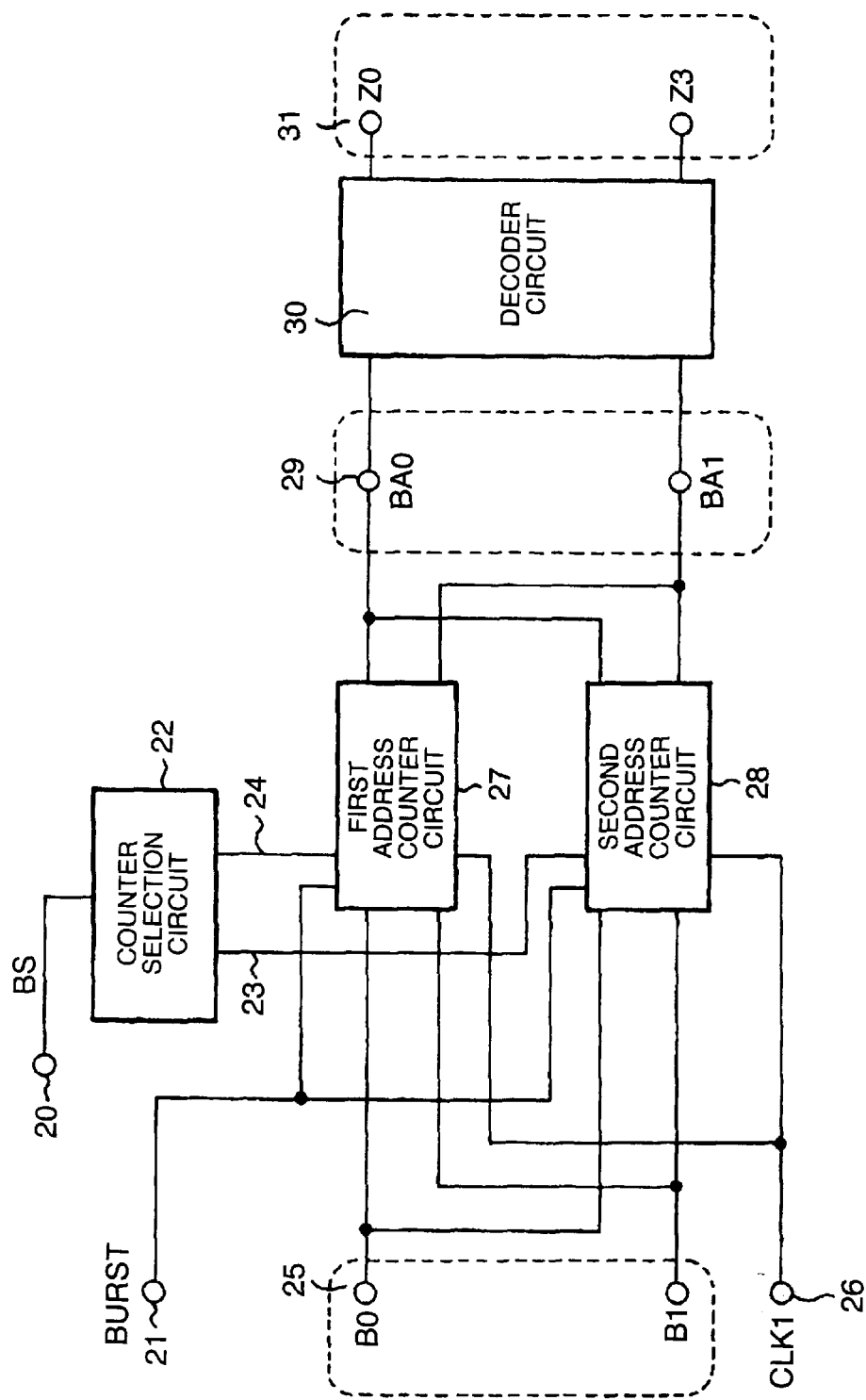
FIG. 1 is a circuit diagram of an address generation control circuit according to a first embodiment of the invention.

FIG. 1 is a circuit diagram of the address generation control circuit 12 according to the first embodiment of the invention.

The address generation control circuit 12 of the first embodiment is now described with reference to FIG. 1.

The address generation control circuit 12 comprises a first address counter circuit 27, a second address counter circuit 28, a counter selection circuit 22 and a decoder circuit 30.

The counter selection circuit 22 is connected to a terminal to which the control signal BS is supplied. The counter selection circuit 22 is a circuit for outputting selection signals 23, 24 for alternately selecting either the first address counter circuit 27 or the second address counter circuit 28 (and for not selecting both). That is, the counter selection circuit 22 switches alternately levels of the selection signals 23, 24 every time the burst control signal BS becomes H level and outputs the selected signals.

The first and second address counter circuits 27, 28 are connected to an input terminal 25 to which an address signal BA (first address signal of the burst address signal) is supplied from the column latch circuit 6, the counter selection circuit 22 and an output terminal 29.

The first and second address counter circuits 27, 28 latch therein the address signal BA supplied thereto from the input terminal 25 and output the latched address signal BA to the output terminal 29 when receiving the selection signals of H level and the burst control signal BURST of H level respectively, then they output an internally generated burst address signal to the output terminal 29 in response to an internal clock signal while still receiving the burst control signal BURST of H level. Further, the first and second address counter circuits 27, 28 output the address signal BA from the input terminal 25 to the output terminal 29 while receiving the burst control signal BURST of L level and the selection signals of H level. Accordingly, in this state, if the address signal BA supplied to the input terminal 25 is updated, a signal supplied to the output terminal 29 is also changed in accordance with the update of the address signal BA.

The first and second address counter circuits 27, 28 supply the address signal BA from the input terminal 25 to each input terminal of transistors provided at each front stage of their output, described later, while receiving the selection signals of L level. However, these transistors are OFF on the basis of the selection signals of H level so that the address signal BA is inhibited to output from the first and second address counter circuits 27, 28 to the output terminal 29.

Figure 4:
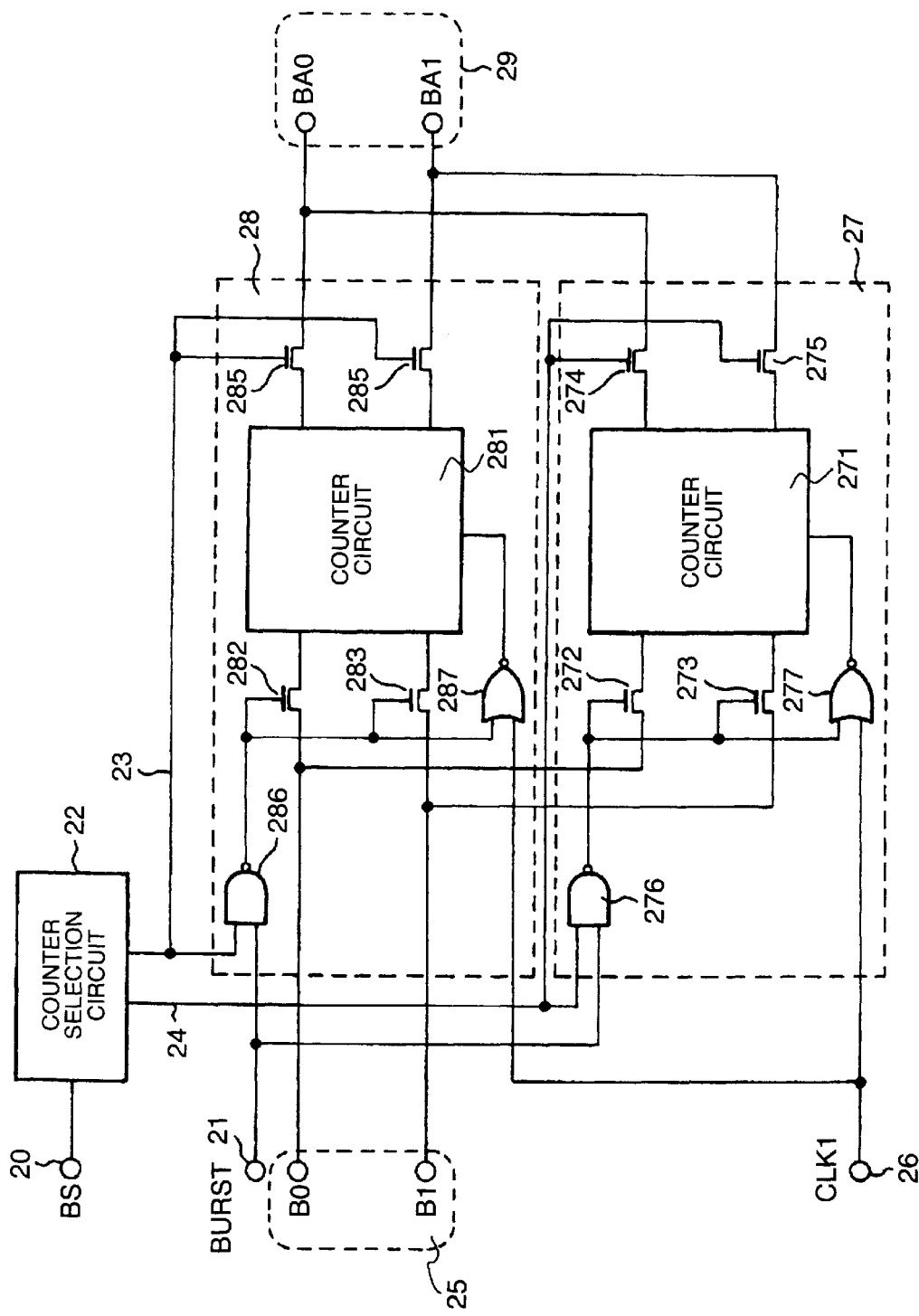
FIG. 4 is a circuit diagram of an address counter in FIG. 1.

FIG. 4 is a view showing internal circuits of the first and second address counter circuits 27, 28.

The first address counter circuit 27 comprises a counter circuit 271, NMOS transistors (hereinafter referred to as NMOSs) 272 to 275, a NAND circuit 276 and a NOR circuit 277.

The NAND circuit 276 receives the selection signal 24 and the burst control signal BURST.

The NAND circuit 276 outputs a signal of L level, turns off NMOSs 272, 273 and inhibits the supply of the address signal BA from the input terminal 25 to the counter circuit 271 when receiving the selection signals 24 of H level and the burst control signal BURST of H level respectively. The NAND circuit 276 outputs a signal of H level, turns on the NMOSs 272, 273, and controls for allowing the address signal BA to be supplied from the input terminal 25 to the counter circuit 271 while either the selection signal 24 or the burst control signal BURST is in low level (hereinafter simply referred to as L level) or both of the selection signal 24 and burst control signal BURST are L level.

The counter circuit 271 outputs the address signal BA supplied to the input terminal 25 when the NMOSs 272, 273 are ON. Further, the counter circuit 271 latches the address signal BA which is in advance supplied from the input terminal 25 thereto and outputs the latched address signal burst address signal BA when the NMOSs 272, 273 are OFF. Since the output of the NAND circuit 276 is L level immediately thereafter, an internal clock CLK1 is supplied to the counter circuit 271 by way of the NOR circuit 277. The counter circuit 271 outputs an internally generated burst address signal by counting operation in synchronization with the internal clock CLK1. The output of the counter circuit 271 is supplied to the output terminal 29 when NMOSs 274, 275 are ON and it is not supplied to the output terminal 29 when NMOSs 274, 275 are OFF. The NMOSs 274, 275 are ON when receiving the selection signal 24 of H level while NMOSs 274, 275 are OFF when receiving the selection signal 24 of L level.

The second address counter circuit 28 comprises a counter circuit 281, NMOSs 282 to 285, a NAND circuit 286 and a NOR circuit 287. The NAND circuit 286 receives the selection signal 23 and the burst control signal BURST, and when it receives the selection signal 23 of H level and the burst control signal BURST of H level, it outputs a signal of L level, turns off the NMOSs 282, 283 and inhibit the supply of the address signal BA from the input terminal 25 to the counter circuit 281.

Further, the NAND circuit 286 outputs a signal of H level, turns on the NMOSs 282, 283, and controls for allowing the address signal BA to be inputted from the input terminal 25 to the counter circuit 281 while either the selection signal 23 or the burst control signal BURST is L level or both of the selection signal 23 and burst control signal BURST are L level. The counter circuit 281 outputs the address signal BA supplied to the input terminal 25 when the NMOSs 282, 283 are ON. Further, the counter circuit 281 latches the address signal BA which is in advance supplied from the input terminal 25 thereto and outputs the latched address signal burst address signal BA when the NMOSs 282, 283 are OFF. Since the output of the NAND circuit 276 is L level immediately thereafter, the internal clock CLK1 is supplied to the counter circuit 281 by way of the NOR circuit NOR circuit 287. The counter circuit 281 outputs an internally generated burst address signal by counting operation in synchronization with the internal clock CLK1. The output of the counter circuit 281 is supplied to the output terminal 29 when NMOSs 284, 285 are ON and it is not supplied to the output terminal 29 when NMOSs 284, 285 are OFF. The NMOSs 284, 285 are ON when receiving the selection signal 23 of H level while NMOSs 284, 285 are OFF when receiving the selection signal 23 of L level.

The decoder circuit 30 is connected to the output terminal 29, decodes a signal supplied to the output terminal 29 and supplies the decoded signal to the output terminal 31.

The output terminal 31 is connected to the first latch circuit 11 and a signal supplied to the output terminal 31 is supplied to the first latch circuit 11.

Figure 5:
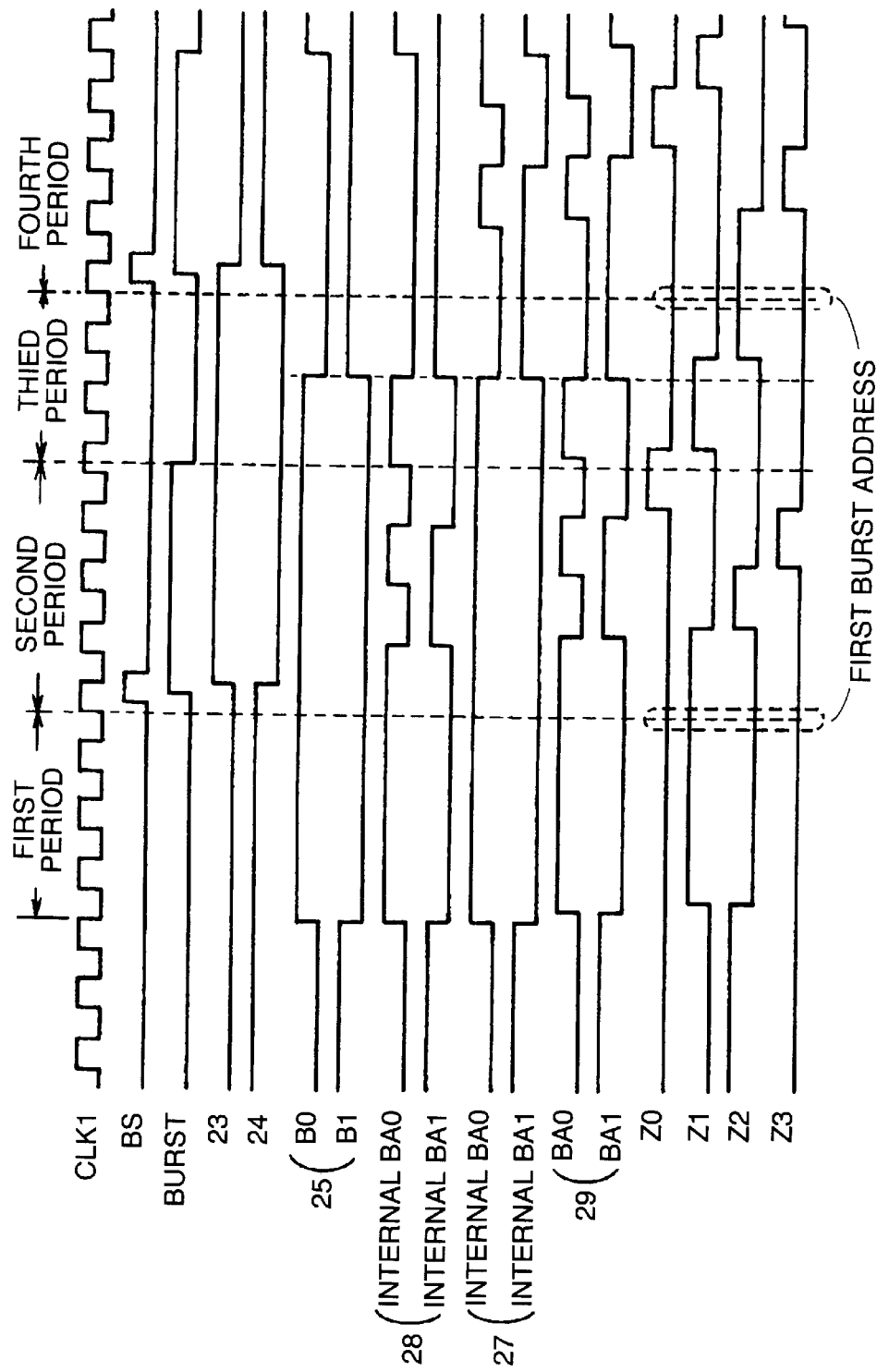
FIG. 5 is a timing chart of an address control circuit in FIG. 1.

The operation of the address generation control circuit of the first embodiment of the invention is described with reference to FIG. 5.

First Period

Since the selection signal 24 is H level for the first period, the first address counter circuit 27 outputs the address signal BA, which is supplied to the input terminal 25 and having address values (B0, B1)=(1,0), to the output terminal 29. The decoder circuit 30 decodes the address signal BA and outputs the decoded address signal BA to the output terminal 31.

Meanwhile, the second counter circuit 281 is inhibited to output the address signal BA by the NMOSs 284, 285 although the address signal BA is supplied to the input terminals of NMOSs 284, 285.

Second Period

The first address counter circuit 27 outputs the address signal BA to the output terminal 29 in the same manner as the first period until the selection signal 23 of H level is supplied thereto.

The decoder circuit 30 decodes the address signal BA and outputs the decoded address signal BA to the output terminal 31.

Then the counter selection circuit 22 renders the selection signal 23 H level and the selection signal 24 L level when receiving the burst control signal BS of H level.

The second address counter circuit 28 latches the address signal BA and outputs the latched address signal BA when receiving the burst control signal BURST and selected by the selection signal 23 of H level. The decoder circuit 30 decodes the address signal burst address signal BA and outputs the decoded address signal BA to the output terminal 31.

Then, when the second address counter circuit 28 outputs the address signals having address values (0,1), (1,1), (0,0) sequentially to the output terminal 29 in synchronization with the internal clock signal. The decoder circuit 30 decodes the address signals and outputs the decoded address signals to the output terminal 31.

The first address counter circuit 27 supplies the address signal BA which is supplied to the input terminal 25 and has the address value of (1,0), to the input terminals of the NMOSs 274, 275 since the selection signal 24 is L level and not selected. The first address counter circuit 27 is inhibited to output the address signal BA to the output terminal 29 because the NMOSs 274, 275 are OFF.

Third Period

Then, the second address counter circuit 28 outputs the address signal BA, which is supplied to the input terminal 25 and has address value of (1,0), to the output terminal 29 when receiving the burst control signal BURST of L level. The decoder circuit 30 decodes this address signal BA and outputs the decoded address signal BA to the output terminal 31.

Meanwhile, since the first address counter circuit 27 receives the selection signal of L level and it is not selected for this period, it is inhibited to output the address signal BA to the output terminal 29 because the NMOSs 274, 275 are OFF although the address signal BA, which is supplied to the input terminal 25 and has address value (1,0), is supplied to the input terminals of the NMOSs 274, 275.

Thereafter, when the address signal BA supplied to the input terminal 25 is changed to that having address value (0,1), the second address counter circuit 28 outputs the address signal BA having the address value (0,1) to the output terminal 29. The decoder circuit 30 decodes this signal and outputs the decoded signal to the output terminal 31.

Further, the address signal BA having address value (0,1) is supplied to the input terminals of the NMOSs 274, 275 in response to the switching of the address signal BA which is supplied to the input terminal 25 to that having address value (0,1). However, the first address counter circuit 27 is inhibited to output the address signal BA to the output terminal 29 because the NMOSs 274, 275 are OFF.

Fourth Period

The second address counter circuit 28 outputs the address signal BA having address value (0,1) to the output terminal 29 until it receives the selection signal 24 of H level in the same manner as the third period. The decoder circuit 30 decodes this signal and outputs the decoded signal to the output terminal 31.

Then, when the counter selection circuit 22 receives the burst control signal BS of H level, it renders the selection signal 24 H level and the selection signal 23 L level.

When the BURST control signal BURST of H level and the selection signal 24 of H level are supplied to the first address counter circuit 27, the first address counter circuit 27 latches the address signal BA of (0,1) and outputs the latched address signal BA to the output terminal 29. The decoder circuit 30 decodes this signal and outputs the decoded signal to the output terminal 31.

Then, the first address counter circuit 27 outputs internally generated burst address signals of (1,1), (0,0), (1,0) sequentially to the output terminal 29 in synchronization with the internal clock signal.

Although the address signal BA of (1,0) to be supplied to the input terminal 25 is supplied to the input terminals of the NMOSs 284, 285 since the selection signal 23 is L level and second address counter circuit 28 is not selected, the 028 is inhibited to output the address signal BA to the output terminal 29 because the NMOSs 284, 285 are OFF.

As mentioned above, when the counter selection circuit outputs selection signals for alternately selecting either the first or second address counter circuit to the first and second address counter circuits, and the address counter circuit latches therein the address signal BA which is supplied to the input terminal 25 and outputs the latched address signal BA when receiving the BURST control signal BURST of H level and the selection signals of H level respectively. Further, the address counter circuit outputs the address signal BA which is supplied to the input terminal thereof while receiving the selection signals of H level and the BURST control signal BURST of L level.

Accordingly, an address signal BA (an externally supplied address), which is the first address signal of the burst address signal, is outputted to the output terminal 29 before the burst control signal BS of H level is supplied to the output terminal 29. Accordingly, an address signal is outputted to the first latch circuit on the basis of the address signal BA by way of the decoder circuit 30. As a result, this solves the problem that right data can not be outputted to an external device because wrong data is latched by the second latch circuit provided at the rear stage of the first latch circuit.

Figure 6:
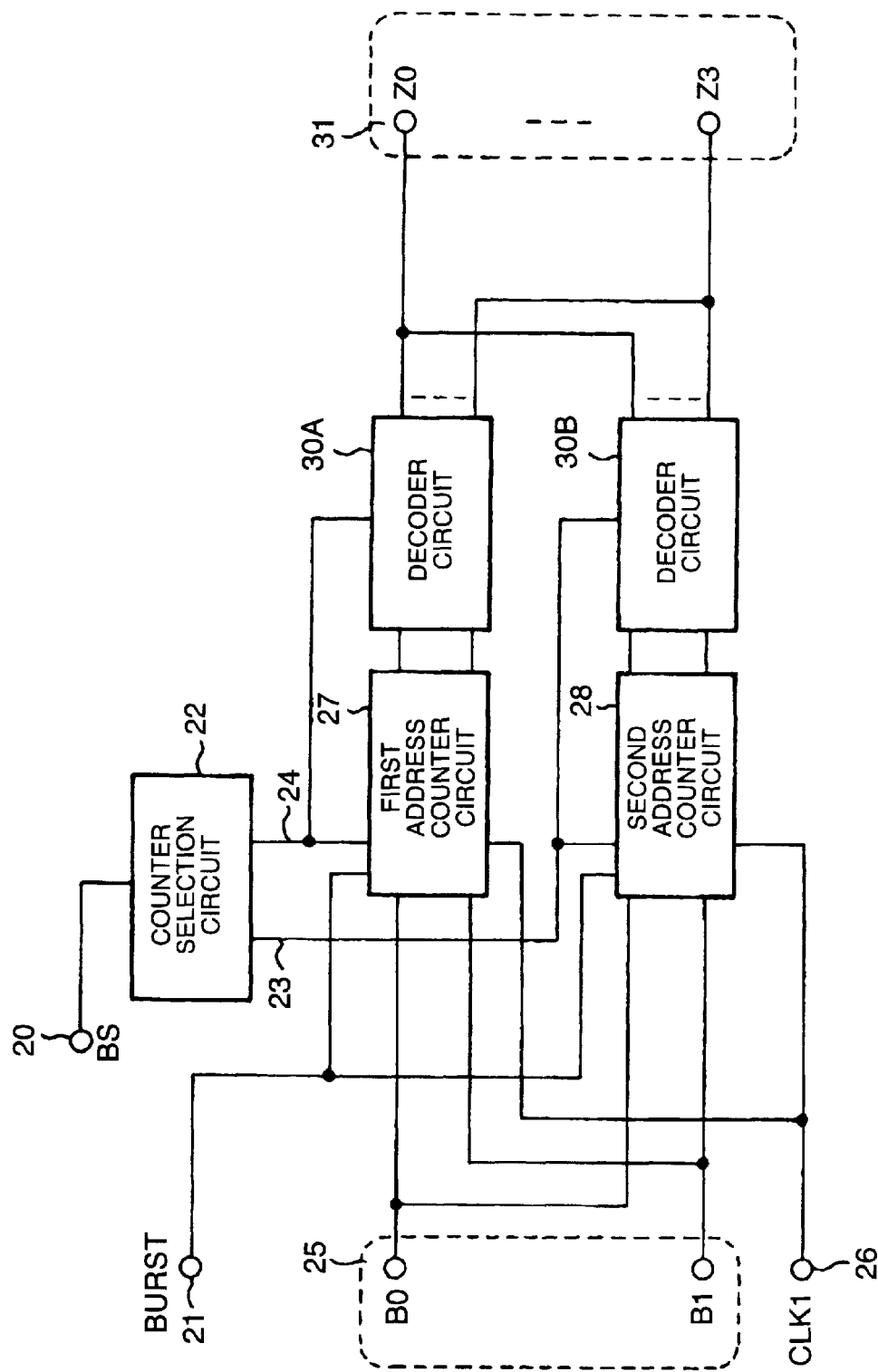
FIG. 6 is a circuit diagram of an address generation control circuit according to a second embodiment of the invention.

FIG. 6 is a circuit diagram of an address generation control circuit according to a second embodiment of the invention.

The address generation control circuit of the second embodiment is a modification of the address generation control circuit of the first embodiment.

Components which are the same as or corresponding to those of the first embodiment are depicted by the same reference numerals.

The counter selection circuit 22 is connected to a terminal to which the control signal BS is supplied. The counter selection circuit 22 is a circuit for outputting selection signals 23, 24 for alternately selecting either the first address counter circuit 27 or the second address counter circuit 28 (and for not selecting). That is, the counter selection circuit 22 switches alternately levels of the selection signals 23, 24 every time the control signal BS becomes H level and outputs the selected signal.

The first and second address counter circuits 27, 28 are connected to an input terminal 25 to which an address signal BA (first address signal of the burst address signal) is supplied from the column latch circuit 6, the counter selection circuit 22 and corresponding first and second decoder circuits 30A and 30B.

Thereafter, the first and second address counter circuits 27, 28 latch therein the address signal BA supplied thereto from the input terminal 25 and output the latched address signal BA to the output terminal 29 when receiving the selection signals of H level and the burst control signal BURST of H level respectively. Thereafter, the first and second address counter circuits 27, 28 output an internally generated burst address signal by counting operation to the corresponding decoder circuits in response to an internal clock signal while still receiving the burst control signal BURST of H level. Further, the first and second address counter circuits 27, second address counter circuit 28 supply the address signal burst address signal BA from the input terminal input terminal 25 to the corresponding decoder circuits while receiving the burst control signal BURST of L level and the selection signals of L level. Accordingly, if the address value of the address signal BA to be supplied to the input terminal 25 is changed in this state, a signal to be supplied to the corresponding decoder circuit is changed accordingly.

That is, the first and second address counter circuits of the second embodiment are circuits having no NMOSs 274, 275, 284, 285 in the first and second address counter circuits of the first embodiment. The first and second address counter circuits output the outputs of the internal counter circuits to the corresponding decoder circuits as they are.

The first decoder circuit 30A and the second decoder circuit 30B decode the outputs from the first address counter circuit 27 and the second address counter circuit 28 respectively. The first decoder circuit 30A and the second decoder circuit 30B output the decoded signals to the output terminal 31 respectively in response to the selection signals 24, 23 of H level. The first decoder circuit 30A and the second decoder circuit 30B do not supply the decoded signals to the output terminal 31 when receiving the selection signals 24, 23 of L level.

Accordingly, a signal to be supplied to the output terminal 31 in the second embodiment is the same as that to be supplied to the output terminal 31 in the first embodiment. However, since an output of the address counter circuit in the second embodiment is decoded in advance by the decoder circuit and an output of the decoder circuit is controlled by selection signals, the speed of a signal to be supplied to the output terminal 31 and the first latch circuit is faster than that to be supplied to the output terminal 31 and the latch circuit in the first embodiment.

Figure 7:
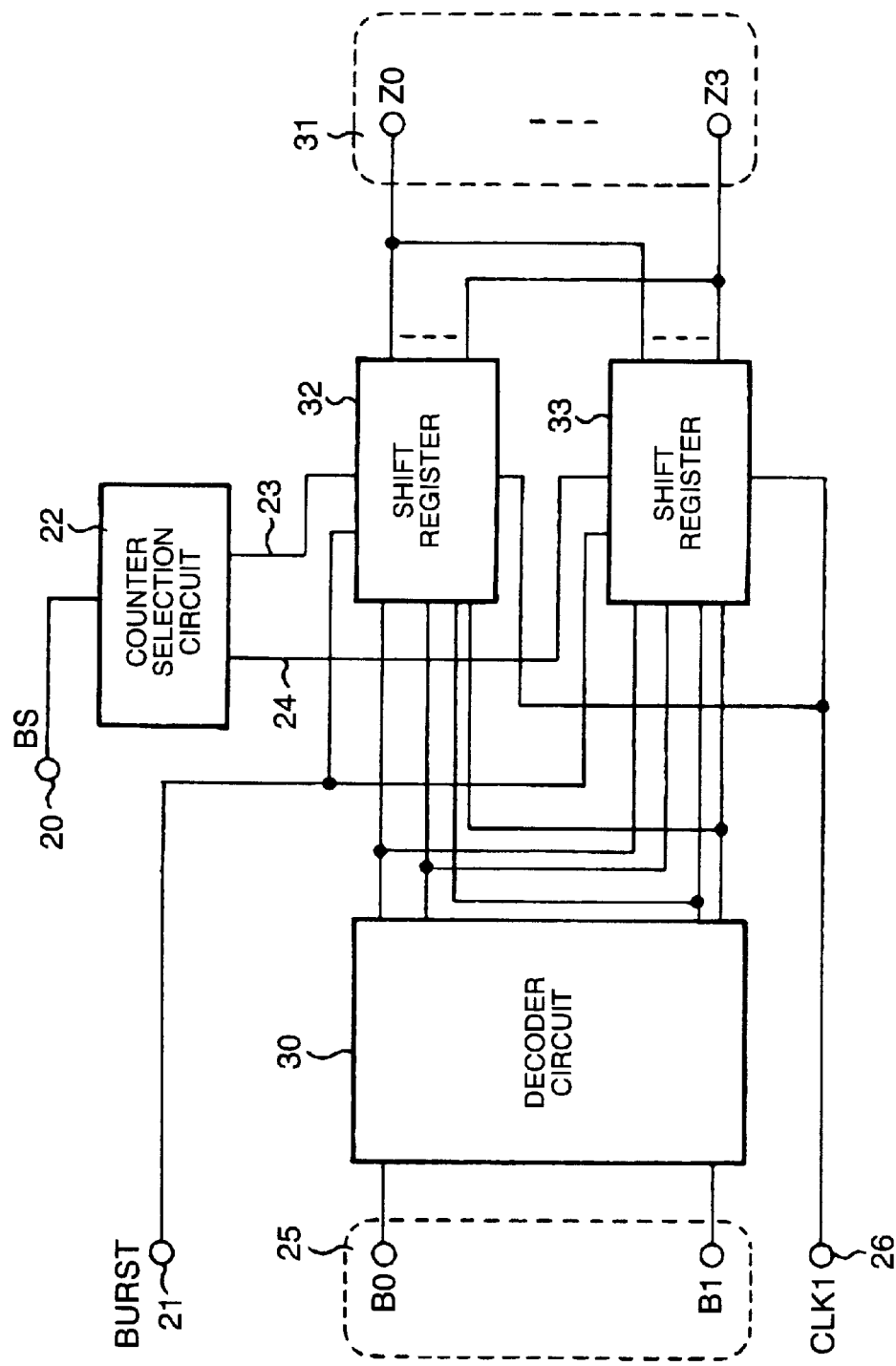
FIG. 7 is a circuit diagram of an address generation control circuit according to a third embodiment of the invention.

FIG. 7 is a circuit diagram of an address generation control circuit according to a third embodiment of the invention. In an address generation circuit according to the third embodiment of the invention, components which are the same as or corresponding to those of the first embodiment are depicted by the same reference numerals.

The address generation control circuit according to the third embodiment has a decoder circuit 30 connected to an input terminal 25 thereof. Accordingly, an address signal generated by decoding an address signal BA to be supplied to the input terminal 25 is supplied to a first shift register 33 and a second shift register 32.

The shift registers 32, 33 are connected to the decoder circuit 30, a counter selection circuit 22 and an output terminal 31.

The shift registers 32, 33 latch therein a signal supplied thereto from the decoder circuit 30 and output the latched signal to the output terminal output terminal 31 when receiving corresponding selection signals of H level and a burst control signal BURST of H level respectively, thereafter they output an internally generated burst address signal to the output terminal 31 in synchronization with an internal clock signal while the burst control signal BURST is H level.

The shift registers 32, 33 output an output signal from the decoder circuit 30 to the output terminal 31 while receiving the selection signals of H level and the burst control signal BURST of L level. The shift registers 32, 33 do not output the output signal from the decoder circuit to the output terminal 31 while receiving the selection signals of L level.

Figure 8:
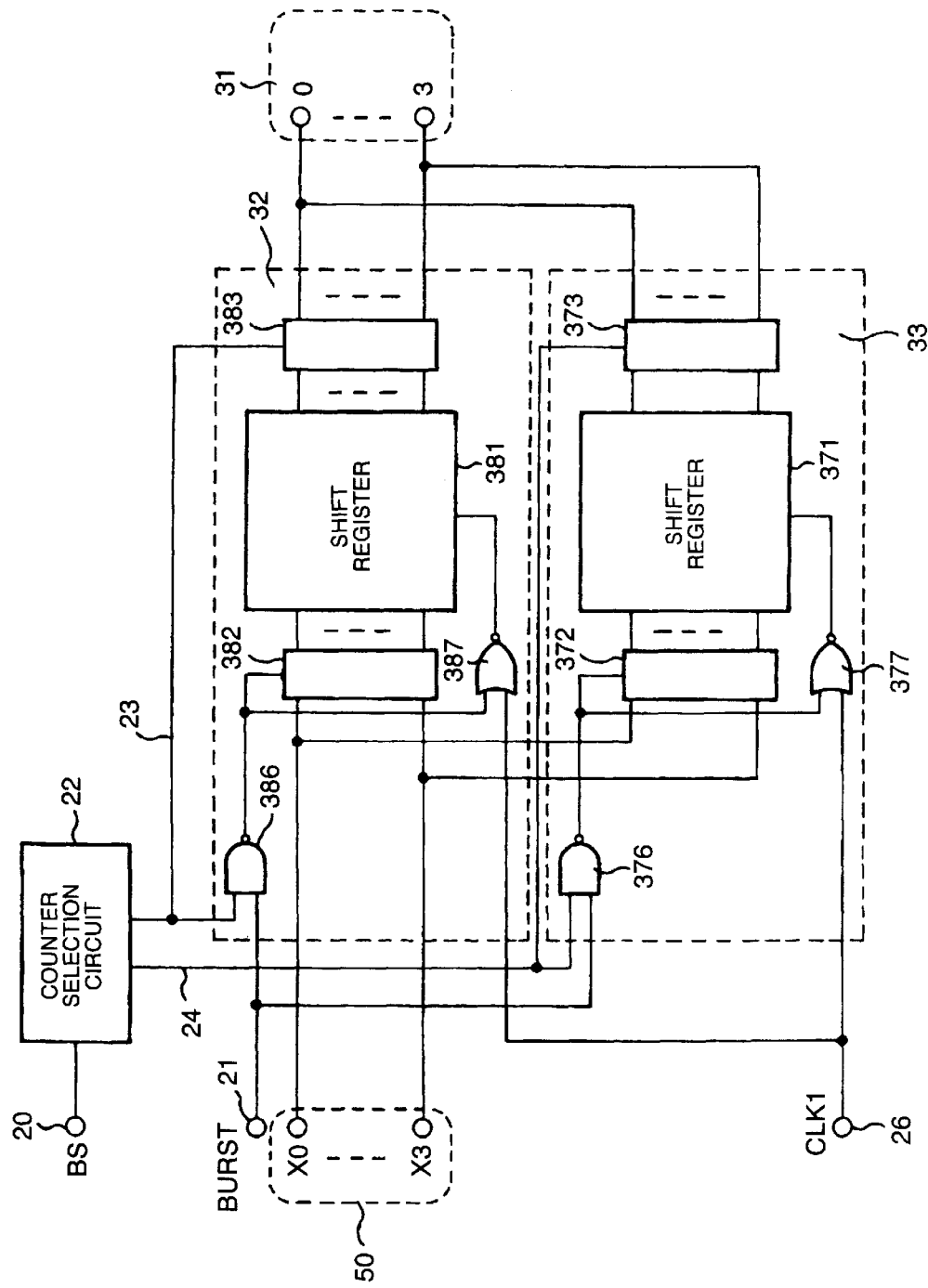
FIG. 8 is a circuit diagram of a shift register in FIG. 7.

FIG. 8 is a view showing internal circuits of the first and second shift registers.

The first shift register 33 comprises a shift register 371, transfer circuits 372, 373, a NAND circuit 376 and a NOR circuit 377. An output signal of the decoder circuit 30 is supplied to a terminal 50.

The NAND circuit 376 receives a selection signal 24 and the burst control signal BURST, and it outputs a signal of L level when receiving the selection signal 24 of H level and the burst control signal BURST of H level respectively. As a result, the NAND circuit 376 renders the transfer registers 372 nonconductive so as to inhibit the supply of an output signal (signal generated by decoding the address signal BA) from the terminal 50 connected to the decoder circuit 30 to the shift register 371.

The NAND circuit 376 outputs a signal of H level to render the transfer register 372 conductive when either the selection signal 24 or a burst control signal BURST or both of them are L level. As a result, the NAND circuit 376 controls so as to supply the output signal from the terminal 50 to the shift register 371.

The shift register 371 outputs an output signal to be supplied to the terminal 50 when the transfer registers 372 is conductive. The shift register 371 latches the output signal which is in advance supplied thereto from the terminal 50, and outputs the latched signal when the transfer register 372 is nonconductive. Thereafter, an internal clock CLK1 is supplied to the shift register 371 by way of the NOR circuit 377 because the output of the NAND circuit 376 is L level. The shift register 371 outputs an internally generated burst address signal in synchronization with the internal clock CLK1.

The output of the shift register 371 is supplied to the output terminal 31 when the transfer circuit 373 is conductive while it is not supplied to the output terminal 31 when the transfer circuit 373 is nonconductive. The transfer circuit 373 becomes conductive when the selection signal 24 is H level and becomes nonconductive when the selection signal 24 is L level.

The second shift register 32 comprises a shift register 381, transfer circuits 382, 383, a NAND circuit 386 and a NOR circuit 387.

The NAND circuit 386 receives a selection signal 23 and a burst control signal BURST, and it outputs a signal of L level when receiving the selection signal 23 of H level and the burst control signal BURST of H level respectively. As a result, the NAND circuit 386 renders the transfer registers 382 nonconductive so as to inhibit the supply of the output signal (a signal generated by decoding the address signal BA) from the terminal 50 to the shift register 381.

The NAND circuit 386 outputs a signal of H level when either the selection signal 23 or the burst control signal BURST or both of them are L level. The NAND circuit 386 renders the transfer register 382 conductive and controls so as to supply the output signal from the terminal 50 to the shift register 381.

The shift register 381 outputs the output signal from the terminal 50 when the transfer register 382 is conductive. Further, the shift register 381 latches the output signal which is in advance supplied thereto from the terminal 50 and outputs the latched signal when the transfer register 382 is nonconductive. Thereafter, the internal clock CLK1 is supplied to the shift register 381 by way of the NOR circuit 387 because the output of the NAND circuit 386 is L level. The shift register 381 outputs an internally generated burst address signal in synchronization with the internal clock CLK1. The output of the shift register 381 is supplied to the output terminal 31 when the transfer circuit 383 is conductive while it is not supplied to the output terminal 31 when the transfer circuit 383 is nonconductive. The transfer circuit 383 becomes conductive when the selection signal 23 is H level and becomes nonconductive when the selection signal 23 is L level.

The operation is described next with reference to FIG. 9.

First Period

For this period, the decoder circuit 30 outputs a signal D having address value (0100) generated by decoding the address signal BA having address value (1,0) from the input terminal 25. Since the first shift register 33 is selected in this period, the first shift register 33 outputs this signal to the output terminal 31.

Second Period

This period is the same as the first period while the selection signal 24 is H level.

When the burst control signal BURST and the selection signal 23 become H level, the second shift register 32 is selected so that the second shift register 32 latches therein the signal D having address value (0100) and outputs the latched signal. Further, the second shift register 32 outputs address signals having address values (0010), (0001), (1000) in synchronization with the internal clock while the burst control signal BURST is H level.

Third Period

For this period, the second shift register 32 outputs the signal from the decoder circuit 30. Accordingly, the address value (0100) of the signal D to be supplied to the output terminal 31 is changed to the address value (0010) as the address value (1,0) of the address signal BA is changed to the address value (0,1).

Fourth Period

The second shift register 32 outputs the signal D having address value (0010) to the output terminal 31 while the selection signal 23 is H level. When the selection signal 24 is changed to H level, the first shift register 33 is selected, so that the first shift register 33 latches the signal D having address value (0010) and outputs the latched signal D. Further, the first shift register 33 outputs the address signals having address values (0001), (1000), (0100) in synchronization with the internal clock while the burst control signal BURST is H level.

In the address generation control circuit of the third embodiment, the address signal BA, which is supplied in advance to the input terminal 25, is decoded by the decoder circuit 30, and the shift register outputs the address signal to the decoder circuit 30 on the basis of the decoded signal in response to the burst control signal BURST, the selection signals, and the clock signal.

Accordingly, the address generation control circuit of the third embodiment supplies the signal to the latch circuit 11 faster than that of the first embodiment which further decodes the address signal outputted from the address counter in response to the burst control signal BURST, the selection signals and the clock signal.

The counter selection circuit according to the first to third embodiments receive two signals, i.e. the burst control signal BS and the burst control signal BURST, but they may receive the burst control signal BURST instead of the burst control signal BS, whereby the outputs of the selection signals 23, 24 may be alternately changed every time they may receive the burst control signal BURST of H level.

TRANSLATION OF DRAWINGS

FIG. 1

22: COUNTER SELECTION CIRCUIT
27: FIRST ADDRESS COUNTER CIRCUIT
28: SECOND ADDRESS COUNTER CIRCUIT
30: DECODER CIRCUIT

FIG. 2

1: ADDRESS BUFFER
2
3
4: MEMORY CELL ARRAY
5: MODE REGISTER
6: COLUMN LATCH CIRCUIT
7: COLUMN DECODER
8: SENSE AMPLIFIER GROUP
9: COMMAND CONTROL CIRCUIT
10: TIMING CONTROL CIRCUIT
11: FIRST LATCH CIRCUIT
12: ADDRESS GENERATION CONTROL CIRCUIT
13: CLOCK BUFFER
14: BURST CONTROL CIRCUIT
15: LATCH CIRCUIT
16: OUTPUT BUFFER

FIG. 4

22: COUNTER SELECTION CIRCUIT
271: COUNTER CIRCUIT
281: COUNTER CIRCUIT

FIG. 6

22: COUNTER SELECTION CIRCUIT
27: FIRST ADDRESS COUNTER CIRCUIT
28: SECOND ADDRESS COUNTER CIRCUIT
30A: DECODER CIRCUIT
30B: DECODER CIRCUIT

FIG. 7

22: COUNTER SELECTION CIRCUIT
30: DECODER CIRCUIT
32: SECOND SHIFT REGISTER
33: FIRST SHIFT REGISTER

-continued

TRANSLATION OF DRAWINGS

FIG. 8

22: COUNTER SELECTION CIRCUIT
371: SHIFT REGISTER
381: SHIFT REGISTER

What is claimed is:

1. A semiconductor burst nonvolatile semiconductor memory comprising:

a memory cell group for storing data therein;

an input terminal group to which an address signal is supplied;

an intermediate terminal;

an output terminal group;

a latch circuit which stores data read out from the memory cell group and outputs the same data from an address indicated by a signal supplied to the output terminal group;

a first address counter circuit and a second address counter circuit coupled respectively between the input terminal group and the intermediate terminal group, each address counter circuit of the first address counter circuit and the second address counter circuit latching therein an address signal which is supplied to the input terminal group, and outputting the latched address signal to the intermediate terminal group and a burst address signal generated by itself to the intermediate terminal group when receiving a first burst control signal of first level and selected by selection signals, each address counter circuit of the first address counter circuit and the second address counter circuit transferring the address signal which is supplied to the input terminal group to the intermediate terminal group when receiving a first burst control signal of second level and selected by the selection signals;

a selection circuit which outputs the selection signals to alternately select either the first address counter circuit or the second address counter circuit in response to a second burst control signal; and a decoder circuit which decodes a signal which is supplied to the intermediate terminal group and outputting the decoded signal to the output terminal group.

2. The semiconductor burst nonvolatile semiconductor memory according to claim 1, wherein the first burst control signal is the second burst control signal.

3. The semiconductor burst nonvolatile semiconductor memory according to claim 1, wherein the address signal which is supplied to the input terminal group is an externally supplied address signal.

4. A semiconductor burst nonvolatile semiconductor memory comprising:

a memory cell group for storing data therein;

an input terminal group to which an address signal is supplied;

an output terminal group;

a latch circuit which stores data read out from the memory cell group and which outputs the same data from an address indicated by a signal supplied to the output terminal group;

a first address generation circuit and a second address generation circuit coupled respectively between the input terminal group and the output terminal group, said first address generation circuit having a first address counter circuit and a first decoder circuit, said second address generation circuit having a second address counter circuit and a second decoder circuit, each address generation circuit latching therein an address signal which is supplied from the input terminal group, and decoding the latched address signal to output the decoded address signal to the output terminal group, also decoding an address signal generated by itself to output the decoded address signal to the output terminal group when receiving a first burst control signal of first level and selected by the selection signals, said each address generation circuit decoding an address signal supplied from the input terminal group and outputting the decoded address signal to the output terminal group when receiving a first burst control signal of second level and selected by the selection signals; and a selection circuit which outputs the selection signals to alternately select either the first address generation circuit or the second address generation circuit in response to a second burst control signal.

5. The semiconductor burst nonvolatile semiconductor memory according to claim 4, wherein the first burst control signal is the second burst control signal.

6. The semiconductor burst nonvolatile semiconductor memory according to claim 4, wherein the address signal which is supplied to the input terminal group is an externally supplied address signal.

7. A semiconductor burst nonvolatile semiconductor memory comprising:

a memory cell group for storing data therein;

an input terminal group to which an address signal is supplied;

an output terminal group;

a latch circuit which stores data read out from the memory cell group and outputs the same data from an address indicated by a signal supplied to the output terminal group;

a decoder circuit for decoding an address signal supplied to the input terminal group;

a first shift register and a second shifter register, each shift register being coupled to an output of the decoder circuit and the output terminal group, said each shift register latching therein an output signal of the decoder circuit and outputting the latched output signal to the output terminal group and outputting an address signal generated by itself to the output terminal group when receiving a first burst control signal of first level and selected by selection signals, said each shift register transferring the output signal outputted by the decoder circuit to the output terminal group when receiving a first burst control signal of second level and selected by the selection signal; and a selection circuit which outputs the selection signals to alternately select either the first shift register or the second shift register in response to a second burst control signal.

8. The semiconductor burst nonvolatile semiconductor memory according to claim 7, wherein the first burst control signal is the second burst control signal.

9. The semiconductor burst nonvolatile semiconductor memory according to claim 7, wherein the address signal which is supplied to the input terminal group is an externally supplied address signal.

* * * * *